United States Patent [19]
Furlani et al.

[11] Patent Number: 5,888,445
[45] Date of Patent: *Mar. 30, 1999

[54] METHOD FOR MAKING CERAMIC MICRO-ELECTROMECHANICAL PARTS AND TOOLS

[75] Inventors: Edward P. Furlani, Lancaster; Dilip K. Chatterjee; Syamal K. Ghosh, both of Rochester, all of N.Y.

[73] Assignee: Eastman Kodak Company, Rochester, N.Y.

[ * ] Notice: The term of this patent shall not extend beyond the expiration date of Pat. No. 5,791,040.

[21] Appl. No.: 866,991

[22] Filed: Jun. 2, 1997

[51] Int. Cl.$^6$ .................................................... E04B 37/00
[52] U.S. Cl. ............................................ 264/614; 264/619
[58] Field of Search .................................... 264/614, 615, 264/616, 617, 618, 619, 620

[56] References Cited

U.S. PATENT DOCUMENTS

| | | | |
|---|---|---|---|
| 2,820,720 | 1/1958 | Iversen | 117/65 |
| 3,536,798 | 10/1970 | Nyman | 264/62 |
| 4,026,746 | 5/1977 | Straw | 156/155 |
| 5,475,264 | 12/1995 | Sudo et al. | 257/723 |
| 5,614,043 | 3/1997 | Ritland et al. | 156/89 |

FOREIGN PATENT DOCUMENTS 1-022857  8/1990  Japan .

OTHER PUBLICATIONS

Edward P. Furlani et al, "Method and Apparatus for the Formation and Polarization of Micromagnets", USSN 08/795,332, filed Feb. 4, 1997.
Edward P. Fulani et al., "Method for Making Ceramic Tools for the Production of Micromagnets", USSN 08/795,690, filed Feb. 4, 1997.
Dilip K. Chatterjee et al, "A Method for the Fabrication of Micro–electromechanical Ceramic Parts with an Electrical Trace", USSN 08/751,529, filed Nov. 14, 1996.

*Primary Examiner*—Christopher A. Fiorilla
*Attorney, Agent, or Firm*—Mark G. Bocchetti

[57] ABSTRACT

A method for making electromechanical parts and tools having at least one micro-diameter electrically conductive thread incorporated therein is accomplished by molding the elements which form the base for the electromechanical part or tool from a ceramic material and, during the molding step, there are formed one or more bores through each of the base elements. The base elements may be formed individually or at a planar array for later separation into individual elements. The base elements are then supported on a micro-porous substrate within a vacuum chamber and one side of the base element is flooded with a molten electrically conductive material. By drawing a vacuum within the vacuum chamber beneath the micro-porous substrate, the molten electrically conductive material is caused to flow into and through at least one bore in each base element. The molten electrically conductive material is then cooled. In such manner, through the molding of the ceramic material into the desired shape with desired bores forming conduits for the molten electromechanical material, a variety of micro-electromechanical parts and tools can be fabricated.

7 Claims, 6 Drawing Sheets

METHOD FOR MAKING CERAMIC MICRO-ELECTROMECHANICAL PARTS AND TOOLS

FIELD OF THE INVENTION

The present invention relates generally to micro-electromechanical parts and tools and, more particularly, to methods for fabricating micro-electromechanical parts and tools from a ceramic material which have incorporated therein at least one micro-diameter, electrically conductive thread.

BACKGROUND OF THE INVENTION

There is a continuing desire to make electromechanical parts and tools of smaller and smaller dimension. Such micro-electromechanical parts and tools will often require at least one and typically multiple electrical conductors embedded therein of micro-diameter. By micro-diameter as used herein, it is meant diameters on the order of 100 microns. As a practical matter, even though conductors such as bonding wire as used in the assembly of integrated circuits are available in diameters down to about 1.25 mils, it is difficult to produce continuous electrical conductors having a diameter in the range of 100 microns. Further, conventional methods would make it impractical, if not impossible, to precisely thread such micro-diameter conductors through a micro-sized electromechanical part or tool to thereby embed the conductor therein. Heretofore, the prior art has lacked the ability to produce electromechanical parts and tools wherein one or more micro-diameter electrical conductors can be embedded therein with assurance of continuity.

SUMMARY OF THE INVENTION

It is, therefore, an object of the present invention to provide a method for molding micro-electromechanical parts and tools from ceramics.

It is a further object of the present invention to provide a method for embedding micro-sized electrical conductors in molded ceramic articles.

Still another object of the present invention is to provide a method for fabricating micro-electromechanical parts and tools which allows for the incorporation of other components necessary for the operation of the part or tool.

Briefly stated, these and numerous other features, objects and advantages of the present invention will become readily apparent upon a reading of the detailed description, claims and drawings set forth herein. These features, objects and advantages are accomplished by micromolding ceramic base elements either individually or as an array of multiple base elements wherein the operation of molding such base elements provides such base elements with the desired conduit paths for the electrical conductors needed for the particular part or tool being molded. In order to accomplish this it is necessary that the conduit path be formed as a series of full penetration orifices through the thickness of the base element which can later be filled with a molten conductive metal such as gold, silver, an alloy of silver and copper, or an alloy of copper and tin using a vacuum to draw the molten conductive metal into and through the orifices. The conduit path molded into the ceramic base elements may also include channels molded into the surface of the base elements. In such manner, the molten electrically conductive metal can also be caused to fill such channels which may be formed so as to connect two or more of the full thickness orifices through the base element. Thus, using the method of the present invention, a variety of electromechanical parts and tools can be fabricated such as, for example, a micro-sized transformer or an apparatus for the formation and polarization of micromagnets.

DETAILED DESCRIPTION OF THE INVENTION

Figure 1:
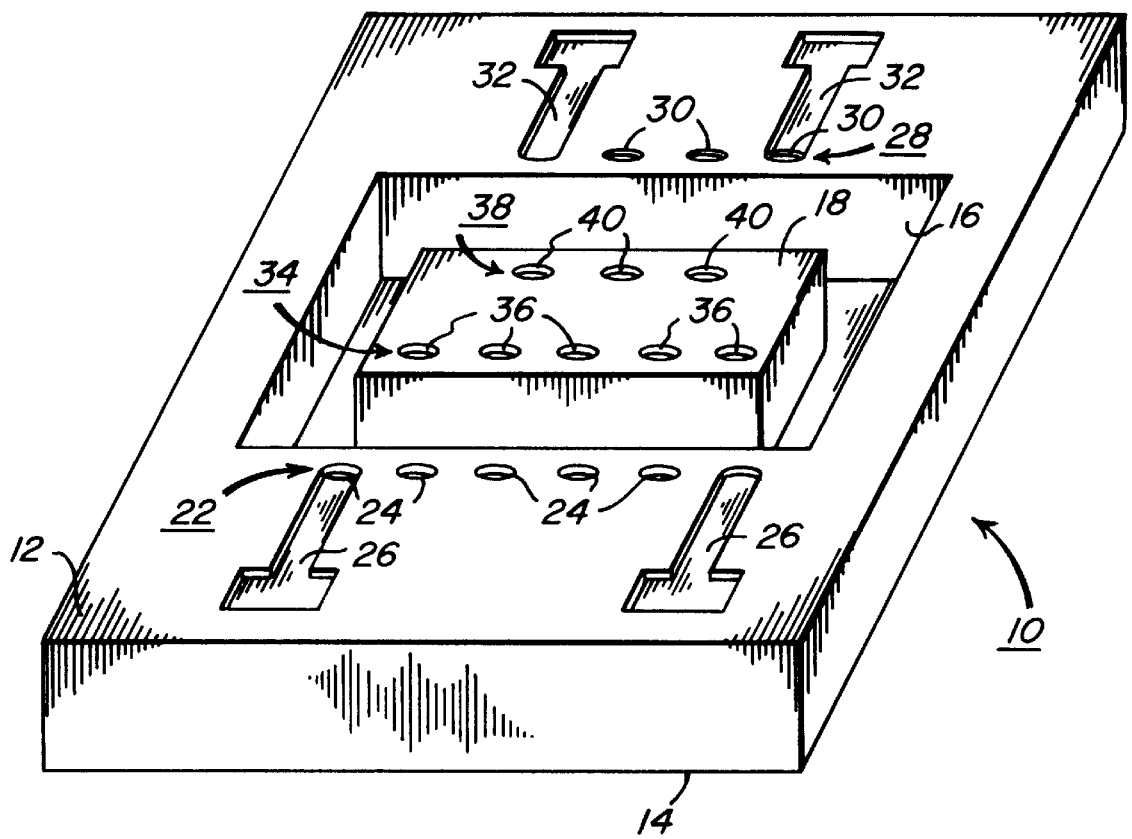
FIG. 1 is a perspective view of a base element for a molded, micro-sized transformer incorporating bores therethrough for the receipt of micro-diameter electrical conductors.
Figure 2:
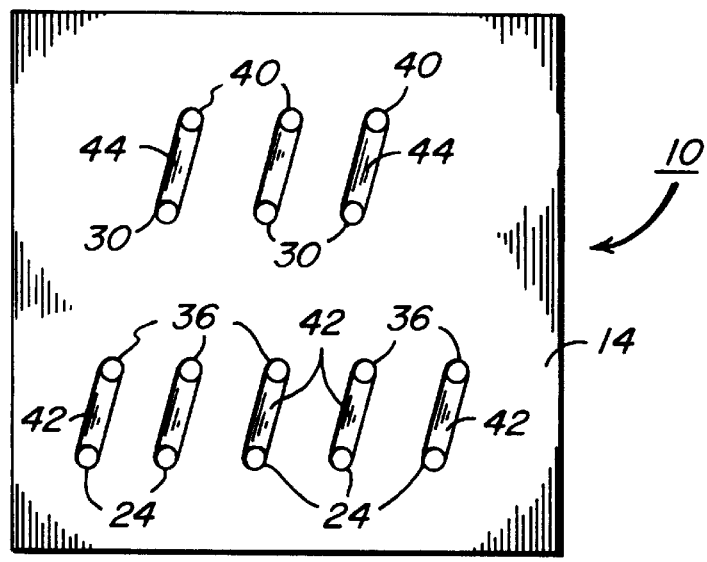
FIG. 2 is a bottom plan view of the base element depicted in FIG. 1.

The method of the present invention can be used to fabricate a variety of molded, micro-electromechanical parts and tools which include at least one threaded electrical conductor therein. As mentioned above, an example of one such molded, micro-electromechanical part is a micro-sized transformer. For purposes of illustration, the method of the present invention will be described in detail using a micro-sized transformer as an example. The term "micro-sized" as used herein in conjunction with tools and parts is intended to mean parts and tools having volumes on the order of one (1) mm$^3$. The terms "micro-sized", "micro-diameter", and "micro-dimensioned" as used herein in conjunction with specific features (e.g. bores, channels, orifices, ports, conductors, canals, etc.) of the tool or part are intended to mean features where at least one dimension thereof is on the order of one (1) $\mu$m. Therefore, turning first to FIG. 1, there is shown a perspective view of a micromolded ceramic transformer base element 10. Base element 10 includes a top surface 12 and a bottom surface 14. Molded into the top surface of base element 10 is a moat 16 yielding an island 18. Adjacent one side of moat 16 is a first row 22 of orifices 24. Orifices 24 have a micro-diameter. There is a T-shaped channel 26 formed in the top surface 12 which intersect the two end orifices 24 of row 22. There is a second row 28 of orifices 30 adjacent the opposing side of moat 16. Orifices 30 have a micro-diameter. A second set of T-shaped channels 32 is formed in the top surface 12 which intersect with the two end orifices 30 of second row 28. The depth and/or width of T-shaped channels 26, 32 is micro-dimensioned. There is a third row 34 of orifices 36 and a fourth row 38 of orifices 40 in island 18. Orifices 36, 40 have a micro-diameter. As can be seen from FIG. 2, there is a first set of generally parallel channels 42 and a second set of generally parallel channels 44 formed in the bottom surface 14 of base element 10. The first set of channels 42 connect pairs of orifices 24, 36 while the second set of channels 44 connects pairs of orifices 30, 40. The depth and/or width of channels 42, 44 is micro-dimensioned.

Figure 3:
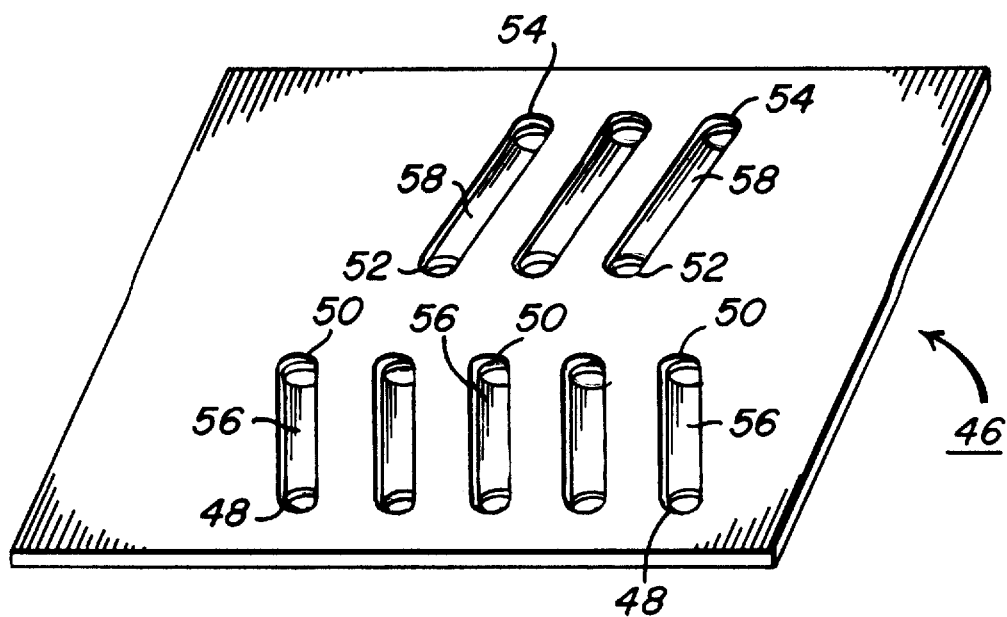
FIG. 3 is a top perspective view of a cap element adapted to be mounted on the base element depicted in FIGS. 1 and 2.
Figure 4:
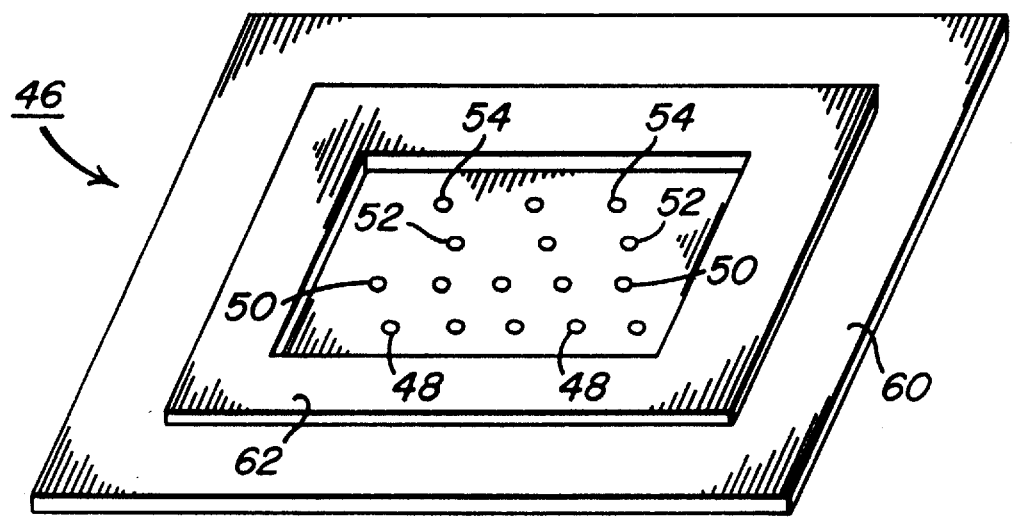
FIG. 4 is a bottom perspective view of the cap element depicted in FIG. 3.

Turning next to FIGS. 3 and 4, there is shown a cap element 46 designed to interlock or press fit or shrink fit with base element 10. Cap element 46 includes a first row of ports 48, a second row of ports 50, a third row of ports 52 and a fourth row of ports 54, all formed therethrough. Ports 48, 50, 52, 54 all have a micro-diameter. Connecting first row of ports 48 with second row of ports 50 is a first row of generally parallel canals 56. Connecting third row of ports 52 with fourth row of ports 54 is a second series of generally parallel canals 58 extending from the bottom surface 60 of cap element 46 is rectangular projection 62 which is adapted to reside in moat 16 when cap element 46 is installed on base element 10.

Base element 10 and cap element 46 are both micro-molded from ceramic, preferably alumina. Other ceramics which can be used in the process include zirconia, magnesia and titania, or composites thereof. The preferred method for molding base element 10 and cap element 46 is dry pressing of ceramic powder followed by sintering. The ceramic selected for micromolding base element 10 and cap element 46 must be prepared using very fine particles of ceramics so that during the molding process all of the intricate features of the base element 10 and cap element 46 are replicated with great precision. The average particle size of the selected ceramic particles must be less than about 0.5 $\mu$m. Furthermore, the selected ceramic, in its sintered state, must be electrically insulating and non-magnetic for this example of a transformer. The powder employed to mold the base element 10 and the cap element 46 in its precompacted, presintered form preferably comprises alumina. Other powdered ceramics usable in the practice of the present invention include magnesia, titania, zirconia, and composites thereof, as well as others such as carbides, borides and nitrides. The powder is compacted into a green part by means of a dry press or the like. The term "green part" as used herein means the powder in its compacted, presintered state. The powder should be compacted by applying uniform compacting forces to the powder in order to produce a green part having a uniform density. A preferred compacting device that achieves uniform compacting forces is a floating mold die press. The green part should have a predetermined density selected by the operator to produce, after sintering, a net shaped article. For alumina, the green part should have a density of from about 40 percent to about 60 percent of the sintered density with the sintered density being about 3.9 gms/cc. The compaction pressure determines the density of the green part and consequently that of the sintered ceramic. If the compaction pressure is too low, the ceramic can have a lower than desired density and not attain the desired net shape. If the compaction pressure is too high, the green part can delaminate resulting in a ceramic that is defective for the intended use. The compaction pressure for alumina should be the range of about 10,000 psi to about 15,000 psi, and the preferred compaction pressure for forming base element 10 and cap element 46 is about 12,000 psi.

The compaction time for alumina can be readily determined by the operator depending on the finished part size per compaction time, for example, can be in the range of from about 10 seconds to about 60 seconds for parts ranging from about 1 mm$^3$ to about 100 mm$^3$ in size. To produce the net shape of ceramic base element 10 and ceramic cap element 46, the compaction is carried out for a time sufficient to compact the powder to form a green part having a predetermined density for the selected powder, e.g., from about 1.6 g/cc to about 2.4 g/cc for alumina as described above. It is well known that the compaction pressure and time selected by the operator can be dependent on the size of the finished part. Generally, as the dimensions of the part increase, compaction time also increases.

The powder is compacted in the presence of an organic water-soluble binder, such as polyvinyl alcohol, gelatin, or a polyvinyl ionomer. The binder can be added to and mixed with the powder, for example, by spray drying or ball milling, prior to placing the powder in the press.

Figure 5:
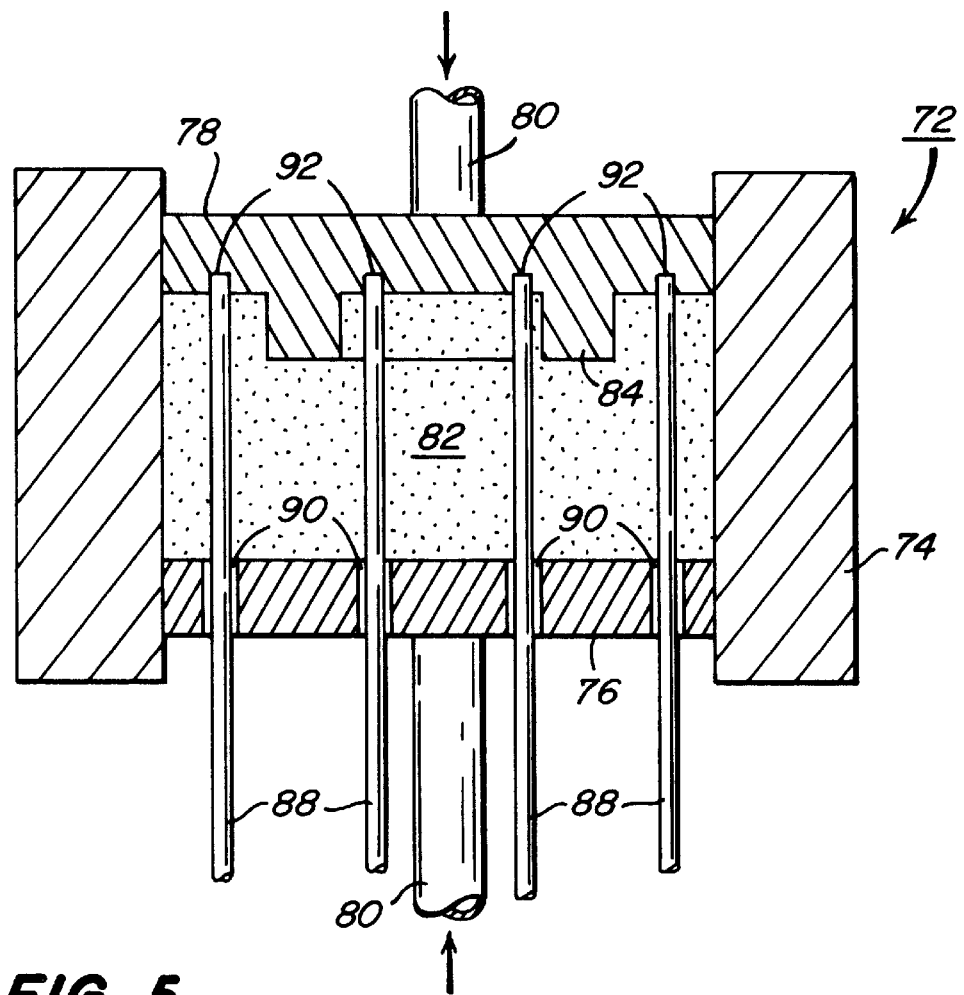
FIG. 5 is a cross-sectional schematic of a pressing apparatus which can be used to micromold the ceramic base element depicted in FIGS. 1 and 2.

Turning to FIG. 5, the punch press 72 for molding base element 10 includes a metal die 74, a lower punch 76 and an upper punch 78. Lower punch 76 and upper punch 78 are mounted to piston members 80 which are used to drive lower punch 76 and upper punch 78 toward one another to compress the ceramic powder 82 contained there between. Upper punch 78 is preferably fabricated by using conventional wire electro-discharge machining (EDM) of either hardenable stainless steel (such as AISI 440 C) or tool steel (D2 or M2). As shown in FIG. 5, upper punch 78 includes the rectangular wall 84 projecting from the bottom surface thereof sized and shaped to form moat 16. Also extending from upper punch 78 are a plurality of rods 88 which form the cylindrical orifices 24, 30, 36, 40. The diameter of rods 88 is preferably in the range of from about 40 $\mu$m to about 200 $\mu$m but can range up to 2000 $\mu$m. There are mating orifices 90 in the lower punch 76 through which rods 88 extend. Rods 88 are fabricated from hardened tool steel and are press fit into receptacles 92 in upper punch 78. The length of rods 88 will be in the range of from about 5 mm to about 20 mm for fabricating base elements 10 having a thickness in the range of from about 1 mm to about 5 mm. Rectangular wall 84 and rods 88 should be made about 22 percent larger than the desired final dimension of moat 16 and orifices 24, 30, 36, 40 to allow for shrinkage of the green ceramic during sintering. The mixture of ceramic powder 82 and organic binders is poured into die 74 and then pressed uniaxially at a pressure preferably about 10,000 psi and not exceeding about 15,000 psi to thereby yield a green ceramic block A single ceramic base element 10, or alternatively, multiple ceramic base elements 10 can be molded simultaneously from the same mold cavity preferably using a dry pressing process or, in the alternative, a cold isostatic pressing process. Of course, it will be appreciated by those skilled in the art that, in order to simultaneously mold multiple base elements 10, it will be necessary to produce an upper punch tool 78 configured to yield a sheet of integrally formed base elements 10. The sheet of integrally formed base elements 10 can be cut into individual ceramic base elements 10. Lower punch 76 and upper punch 78 also preferably include raised features (not shown) to form T-shaped channels 26, 32 and first and second sets of channels 42, 44. Of course, it will appreciated by those skilled in the art that a second pressing operation will be necessary with different upper punch and lower punch tooling in order to form cap elements 46 with the desired features discussed above.

Once a green ceramic base element 10 has been molded, it must be sintered. Sintering schedules will, of course, vary depending on the ceramic use. For alumina, the preferred sintering schedule is to heat the green ceramic base element 10 from an ambient temperature to 600° C. at a rate of 1.5° C. per minute and from 600° C. to 1600° C. at a rate of 5° C. per minute. The temperature should be maintained at 1600° C. a minimum of 60 minutes and then cooled from 1600° C. to 600° C. at a rate of 5° C. per minute. Finally, the temperature should be reduced from 600° C. to room temperature at a rate of 8° C. per minute.

Figure 6:
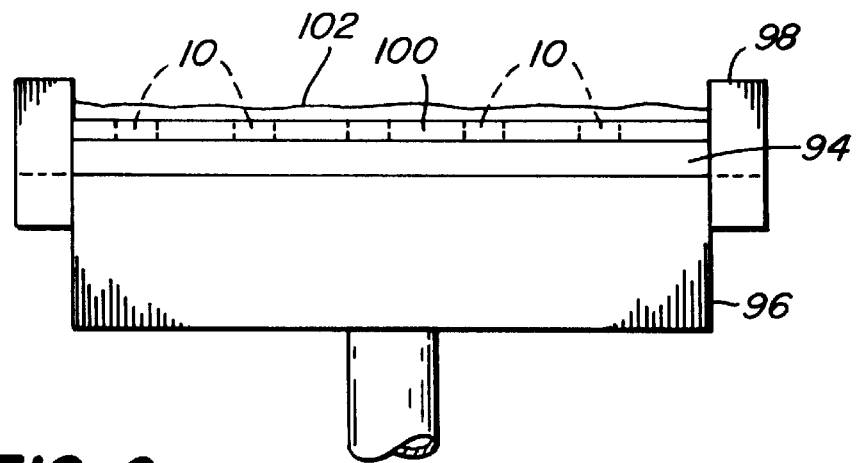
FIG. 6 is a side elevational schematic of a vacuum apparatus used to embed micro-diameter threads of electrically conductive material into molded base elements such as the base element depicted in FIGS. 1 and 2.
Figure 7:
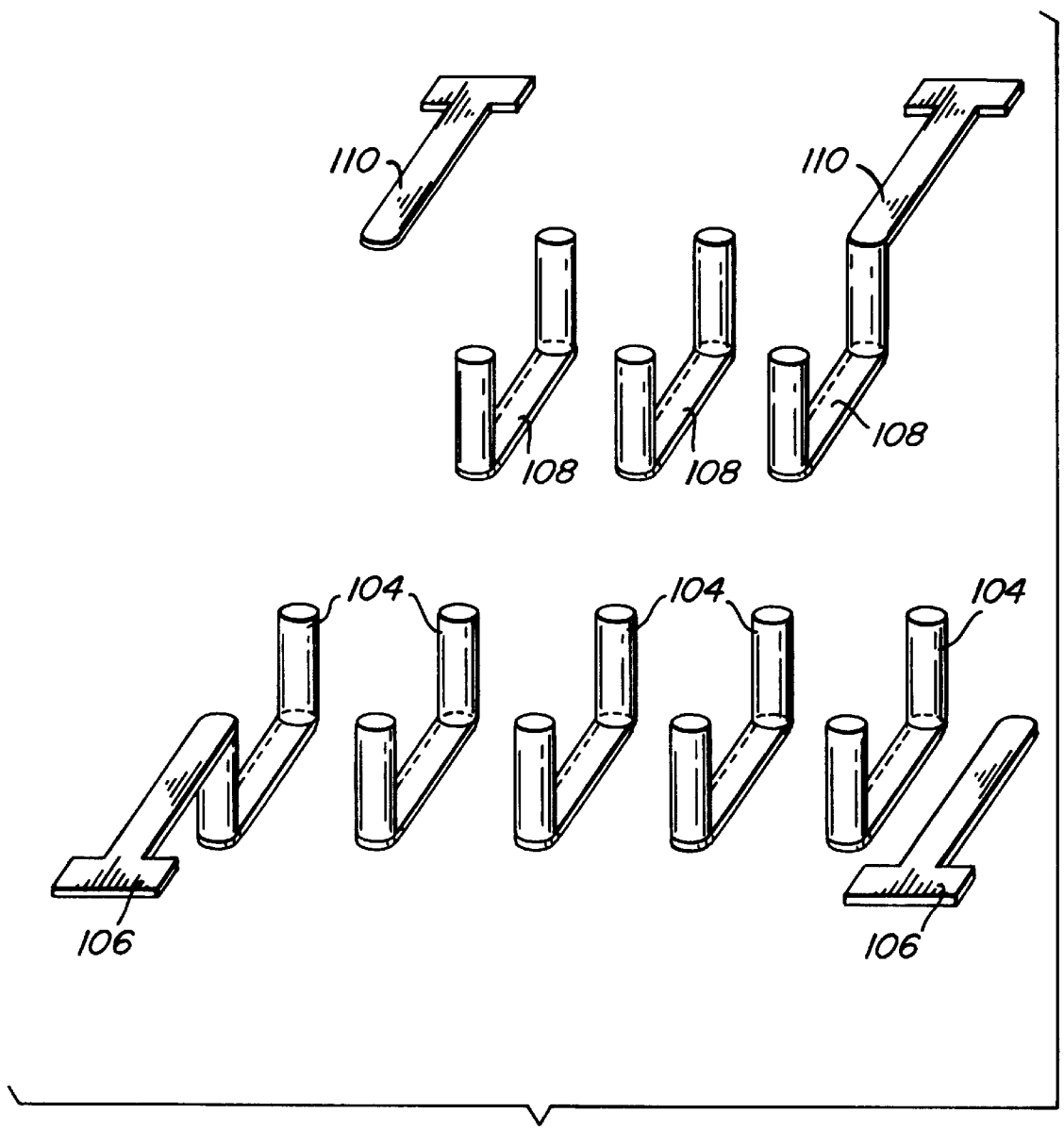
FIG. 7 is a perspective view depicting the micro-sized electrical conductors formed in the base element depicted in FIGS. 1 and 2 by the method of the present invention (the base element is intentionally omitted to show only the electrical conductors).

After sintering of the base element 10 has been completed, it is necessary to fill orifices 24, 30, 36 and 40 with an electrical conductor to form transformer windings. It is efficient if, at the same time, T-shaped channels 26, 32 and the first and second set of generally parallel channels 42, 44 are filled in an electrical conductor at the same time. Suitable electrically conductive materials are thsoe which have very low resistivity such copper, gold, silver, aluminum, and alloys thereof. The method for accomplishing this is schematically depicted in FIG. 6. A microporous ceramic support member 94 is mounted in the vacuum chamber 96. The average pore diameter of the microporous support member 94 is preferably in the range of from about 10 microns to about 30 microns. Porosity or pore density of the microporous support member 94 will generally be in the range of from about 70 percent to about 90 percent. There is a liquid dam 98 surrounding the top portion of the vacuum chamber 96. A sintered, integral array 100 of base elements 10 is supported on microporous support member 94. The edges of the integral array 100 may be sealed against liquid dam 98 using a high temperature refractory of (ceramic) cement. The array 100 is flooded with molten, electrically conductive material 102 and by the application of a vacuum using vacuum chamber 96, the molten electrically conductive material 102 is drawn into orifices 24, 30, 36, 40 as well as channels 26, 32, 40, 44. It is appropriate to orient array 100 on microporous support member 94 such that motes 16 are facing downward toward the microporous support member 94. In such a manner, filling the motes 16 with molten, electrically conductive material 102 can be avoided. At least that portion of the apparatus shown in FIG. 6 containing the microporous support member 94, liquid dam 98, and array 100 should be maintained at a temperature above the melting point of the electrically conductive material 102 during that period of time when the electrically conductive material 102 is being drawn into and through orifices 24, 30, 36, 40 and channels 26, 32, 42, 44. Upon cooling of the array there is formed a first row of U-shaped conductors 104 with a corresponding pair of terminal conductors 106 and a second row of U-shaped conductors 108 with corresponding terminal conductors 110, all embedded within base element 10 (see FIG. 7). Once the formation of the conductors 104, 106, 108, 110 has been completed, the array 100 is separated from the microporous support member 94 and removed from the vacuum chamber 96. The top and bottom surfaces of the array 100 must then be cleaned to remove excess material left over from application of the molten, electrically conductive material 102. Both surfaces of the array 100 can be polished using, for example, a diamond, alumina, or silicon carbide slurry as is well known in the art in order to remove such excess material. The top and bottom surfaces of the array 100 can then be polished in sequence.

The ports 48, 50, 52, 54 and canals 56, 58 formed in cap element 46 are also filled with the same molten, electrically conductive material. All are micro-dimensioned. The method for filling the ports 48,50, 52, 54 and canals 56, 58 may be the same as described above with regard to the base element 10. Once the array 100 has been polished, a diamond saw can be used to cut the array 100 into individual base elements 10. The same is true for a corresponding array of cap elements 46.

Figure 8:
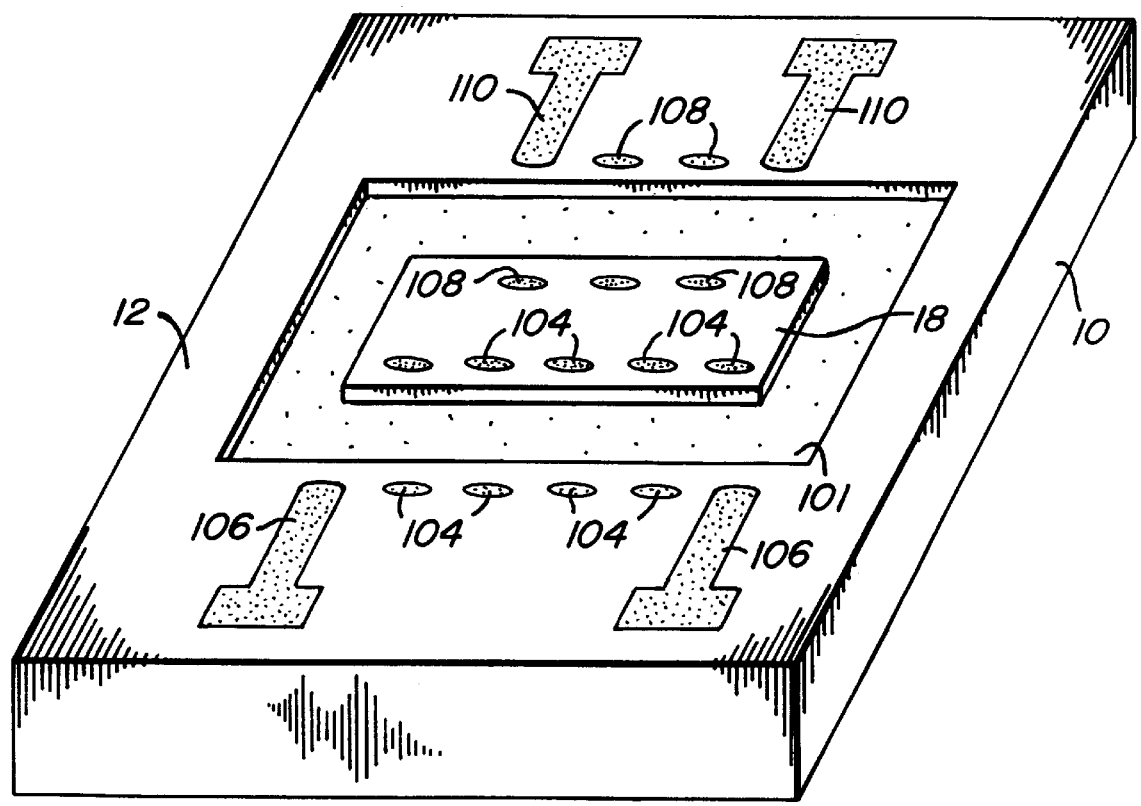
FIG. 8 is a perspective view of the base element depicted in FIG. 1 with the electrical conductors formed therein and the soft magnetic material added thereto.
Figure 9:
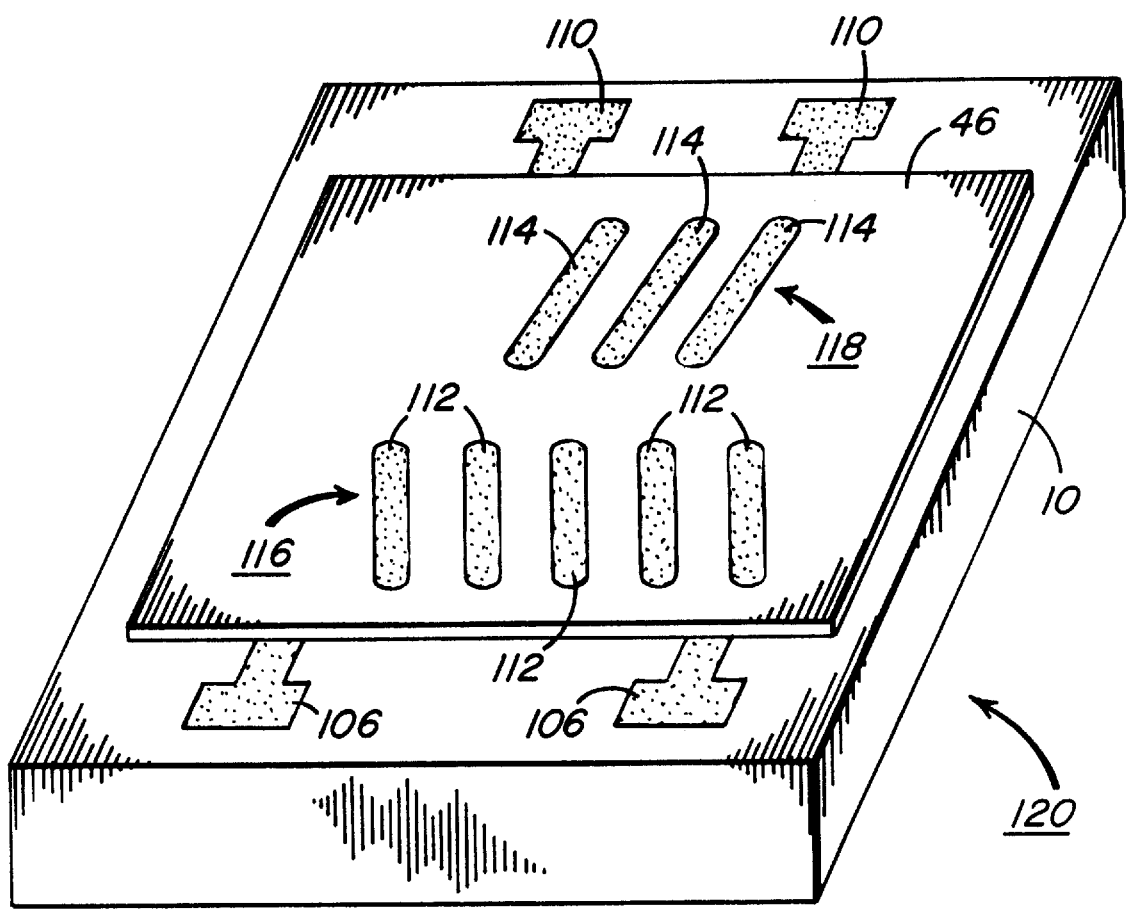
FIG. 9 is a perspective view of the cap element depicted in FIGS. 3 and 4 with the electrical conductors formed therein mounted on the base element depicted in FIGS. 1 and 2 to thereby form a micro-sized electrical transformer.

Either prior to or after cutting the array 100 into individual base elements 10, the moats 16 thereof are filled with a molten pool of soft-magnetic material 101 to form a core for the micro-transformers (see FIG. 8). Soft-magnetic material such as permalloy, supermalloy, iron, nickel, nickel-iron or alloys thereof can be used for this purpose. After motes 16 have been substantially filled with a soft-magnetic material, individual cap elements 46 may be press fit onto base elements 10 such that rectangular projection 62 resides in the top portion of moat 16. Once cap element 46 is press fit onto base element 10, the first row of U-shaped conductors 104 is interconnected by by means of conductors 112 and the second row of U-shaped conductors 108 is interconnected by means of conductors 114, conductors 112, 114 being embedded in cap element 46. Interconnection of conductors can be accomplished by raising the temperature of the combined base element 10 and cap element 46 to the melting point of the electrically conductive material thereby fusing the respective interfacing conductors together. There is formed by the interconnection of the first row of U-shaped conductors 104 and conductors 112, a first winding 116. Similarly, the second row of U-shaped conductors 108 interconnected with conductors 114 forms a second winding 118 (see FIG. 9). In such manner, there is formed a micro-sized electrical transformer 120 as depicted in FIG. 9.

The method of the present invention is useful in forming any micro-sized electromechanical parts or tools which have incorporated therein one or more micro-conductors. Through the application of a vacuum to draw a molten, electrically conductive material through orifices on the order of 100 microns in diameter, the conductors can be embedded in the part. As a practical matter, this could not have been accomplished by attempting to thread a preformed conductor through orifices in such parts.

The invention has been described herein with reference to a micro-sized electrical transformer. Other micro-electromechanical parts and tools can be formed using the method of the present invention. For example, the method of the present invention can be used in making an apparatus for the formation of micromagnets as is described in U.S. patent application 08/795,332 which is hereby incorporated herein by reference. Thus, the method of the present invention is useful in forming any micro-electromechanical part or tool which has incorporated therein at least one micro-sized conductor.

Although bores, ports, orifices and conductors have been discussed herein as having a micro-diameter, it is not intended to limit such features as having a circular cross section. Such features may be formed with a variety of different cross-sectional shapes such as, for example, elliptical, rectangular, triangular, trqapezoidal, etc. Thus, as used herein, "diameter" is intended to refer to various cross-sectional shapes, circular and otherwise, and may be more loosely defined as the average cross-sectional dimension.

An alternative method for assembling the transformer 120 is to form the cap element 46 with preferably at least two additional holes therein. These additional holes would align with moat 16. In such manner, cap element 46 could be installed on base element 10 prior to the addition of the soft magnetic material. Then, using the method of the present invention, molten electrically material could be drawn simultaneously into ports 48, 50, 52, 54 and canals 56, 58 formed in cap element 46, and into orifices 24, 30, 36 and 40, T-shaped channels 26, 32 and the first and second set of generally parallel channels 42, 44 of base element 10. The transformer windings formed thereby would then be continuous. The soft magnetic material could then be added to the moat 16 via the additional holes in the cap element 46 mentioned above. The holes could then be plugged with a suitable material such as, for example, an epoxy resin.

From the foregoing, it will be seen that this invention is one well adapted to obtain all of the ends and objects here and above set forth together with other advantages which are apparent and which are inherent to the process.

It will be understood that certain features and subcombinations are of utility and may be employed with the reference to other features and subcombinations. This is contemplated by and is within the scope of the claims.

As many possible embodiments may be made of the invention without the parting from the scope thereof, it is to be understood that all matter here and set forth and shown in the accompanying drawings is to be interpreted as illustrative and not in a limiting sense.

What is claimed is:

1. A method for making ceramic, micro-electromechanical parts comprising the steps of:
   (a) molding a plurality of base elements in the form of a generally planar array from a ceramic material, said molding step being performed in the presence of an organic water soluble binder;
   (b) forming at least two substantially parallel bores through each of the base elements in the generally planar array;
   (c) sintering the generally planar array;
   (d) supporting the generally planar array on a micro-porous substrate within a chamber;
   (e) flooding one side of the generally planar array with a molten electrically conductive material;
   (f) drawing a vacuum within the chamber on an opposite side of the generally planar array and beneath the micro-porous substrate causing the molten electrically conductive material to fill the at least two substantially parallel bores;
   (g) cooling the molten electrically conductive material to form at least two substantially parallel conductors in each of the base elements; and
   (h) cutting the generally planar array into a plurality of individual micro-electromechanical parts.

2. A method for fabricating ceramic, micro-electromechanical parts comprising the steps of:
   (a) molding a plurality of base elements in the form of a generally planar array from a ceramic material, said molding step being performed in the presence of an organic water soluble binder;
   (b) forming a plurality of substantially parallel bores through each of the base elements in the generally planar array;
   (c) sintering the generally planar array;
   (d) supporting the generally planar array on a micro-porous substrate within a chamber;
   (e) flooding one side of the generally planar array with a molten electrically conductive material;
   (f) drawing a vacuum within the chamber on an opposite side of the generally planar array causing the molten electrically conductive material to flow toward the micro-porous substrate and fill the plurality of substantially parallel bores;
   (g) cooling the molten electrically conductive material to form a plurality of substantially parallel conductors in each of the base elements; and
   (h) cutting the generally planar array into a plurality of individual micro-electromechanical parts.

3. A method as recited in claim 2 further comprising the steps of:
   (a) forming at least one connecting groove in a surface of each of the base elements in the generally planar array between two of the parallel bores of each of the base elements;
   (b) filling the at least one connecting groove in the surface of each of the base elements with the molten electrically conductive material.

4. A method for making ceramic, micro-electromechanical parts comprising the steps of:
   (a) molding a base element from a ceramic material, said molding step being performed in the presence of an organic water soluble binder;
   (b) forming at least two substantially parallel bores through the base element;
   (c) sintering the base element;
   (d) supporting the base element on a micro-porous substrate within a chamber;
   (e) flooding one side of the base element with a molten electrically conductive material;
   (f) drawing a vacuum within the chamber on an opposite side of the base element and beneath the micro-porous substrate and filling the at least two parallel bores with the molten electrically conductive material;
   (g) cooling the molten electrically conductive material to form at least two substantially parallel conductors in each of the base element.

5. A method for fabricating ceramic, micro-electromechanical parts comprising the steps of:
   (a) molding a base elements from a ceramic material, said molding step being performed in the presence of an organic water soluble binder;
   (b) forming at least one bore through the base element;
   (c) sintering the base elements;
   (d) supporting the base element on a micro-porous substrate within a chamber;
   (e) flooding one side of the base element with a molten electrically conductive material;
   (f) filling the at least one bore with the molten electrically conductive material by drawing a vacuum within the chamber on an opposite side of the base element causing the molten electrically conductive material to flow into and through the at least one bore toward the micro-porous substrate;
   (g) cooling the molten electrically conductive material to form at least one micro-diameter conductor in the base element.

6. A method as recited in claim 5 wherein:
   at least two bores through the base element are formed during said forming step.

7. A method as recited in claim 5 further comprising the steps of:
   (a) forming at least one connecting groove in a surface of the base element between two of the parallel bores;
   (b) filling at least one connecting groove in the surface of the base element with the molten electrically conductive material.

* * * * *